(12) United States Patent
Fu et al.

(10) Patent No.: US 10,545,182 B2
(45) Date of Patent: Jan. 28, 2020

(54) CROSSTALK CALIBRATION FOR MULTI-CHANNEL SYSTEMS

(71) Applicant: TEXAS INSTRUMENTS INCORPORATED, Dallas, TX (US)

(72) Inventors: Minghua Fu, Plano, TX (US); Kaichien Tsai, Allen, TX (US); Prashanth Saidu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 258 days.

(21) Appl. No.: 15/072,926

(22) Filed: Mar. 17, 2016

(65) Prior Publication Data

US 2017/0269134 A1    Sep. 21, 2017

(51) Int. Cl.
*G01R 21/133*    (2006.01)
*G01R 35/00*    (2006.01)

(52) U.S. Cl.
CPC ......... *G01R 21/133* (2013.01); *G01R 35/005* (2013.01)

(58) Field of Classification Search
CPC .... G01R 35/005; G01R 35/04; G01R 21/133; G01R 21/14; G01R 21/06; G01R 21/04; G01R 35/002; G01R 35/02
See application file for complete search history.

(56) References Cited

U.S. PATENT DOCUMENTS 3,959,719 A * 5/1976 Espelage ............... H02J 3/1842
323/207

5,548,527 A * 8/1996 Hemminger ......... G01R 21/133
702/62
9,274,201 B2 * 3/2016 Tsai ...................... G01R 35/04
(Continued)

FOREIGN PATENT DOCUMENTS

CN    1201909 A    12/1998
EP    2759842 A1    7/2014
(Continued)

OTHER PUBLICATIONS

International Search Report for PCT/US2017/022684 dated Aug. 14, 2017.
(Continued)

*Primary Examiner* — Nikolay K Yushin
(74) *Attorney, Agent, or Firm* — Ebby Abraham; Charles A. Brill; Frank D. Cimino

(57) ABSTRACT

A system such as an electric meter includes a single-ended analog-to-digital converter which is susceptible to crosstalk. Methods and apparatus are disclosed to calibrate and cancel crosstalk effects. The system determines whether voltage-induced cross-talk is in-phase or out-of-phase with respect to voltage. The system determines a first calibration factor based on minimum and maximum measured current values and voltage. If the cross-talk is in-phase, the system sets a second calibration factor to 0. If the cross-talk is out-of-phase, the system computes the second calibration factor based on a measured current when a power factor angle is set to 90 degrees. Calibration factors may be stored in the multi-channel system. In use, the system measures current and voltage and computes the actual current, voltage and power based on the measured current and voltage by employing a crosstalk cancellation technique using the calibration factors.

20 Claims, 4 Drawing Sheets

(56) References Cited

U.S. PATENT DOCUMENTS

| | | | |
|---|---|---|---|
| 9,322,850 B2 * | 4/2016 | Wood | G01R 1/203 |
| 9,500,714 B2 * | 11/2016 | Rotem | G01R 21/133 |
| 2004/0232904 A1 | 11/2004 | Gandhi | |
| 2014/0253102 A1 * | 9/2014 | Wood | G01R 1/203 |
| | | | 324/140 R |
| 2015/0061636 A1 * | 3/2015 | Tsai | G01R 35/005 |
| | | | 324/74 |
| 2015/0091550 A1 * | 4/2015 | Rotem | G01R 21/133 |
| | | | 324/120 |

FOREIGN PATENT DOCUMENTS

| | | |
|---|---|---|
| WO | 199529409 | 11/1995 |
| WO | 200151937 A1 | 7/2001 |

OTHER PUBLICATIONS

Extended European Search Report dated Mar. 6, 2019, European Application No. 1776518.8, 9 pages.

\* cited by examiner

CROSSTALK CALIBRATION FOR MULTI-CHANNEL SYSTEMS

BACKGROUND

In analog or mixed signal systems when multiple channels of signals are present, crosstalk between the channels can significantly impact signal accuracy. One example of such a mixed signal system is a power metering circuit which may use analog-to-digital converters (ADCs) to measure voltage and current to compute power. Crosstalk between the voltage and current signal paths greatly affects the accuracy of the power computation. The problem is even more apparent in systems which use single-ended ADCs because such systems include a return ground path that is shared by the multiple channels (e.g., voltage and current). A common return makes the system more susceptible to crosstalk.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

As noted above, crosstalk between channels in a multi-channel system may detrimentally impact signal measurement accuracy, especially in systems that use single-ended ADCs. The embodiments described herein provide a calibration technique that addresses this issue thereby permitting single-ended ADCs to be used in a low cost solution for data acquisition. An example of such an embodiment is provided below in the context of an electric meter, but the principles may apply to other types of multichannel systems.

Figure 1:
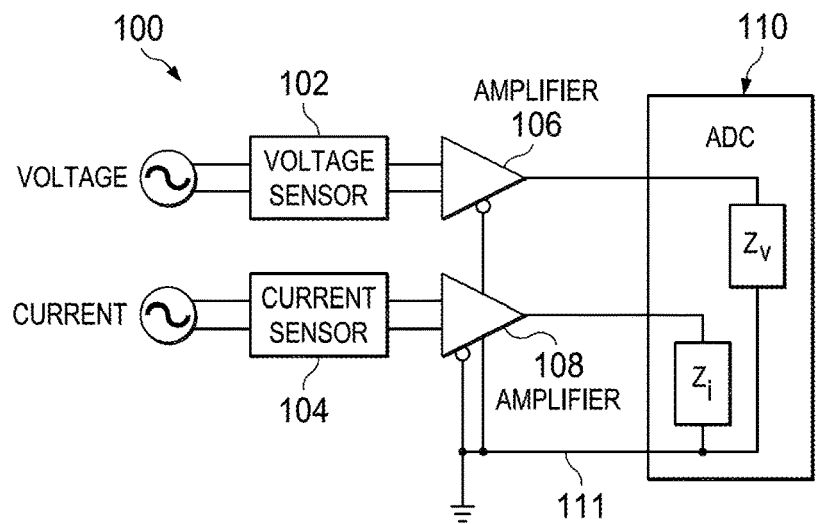
FIG. 1 shows an electric meter circuit in accordance with various examples.

FIG. 1 shows a block diagram of an electric meter 100 in accordance with various embodiments. The illustrative meter 100 receives with two input signals, voltage and current. The circuit 100 comprises a voltage sensor 102, a current sensor 104, a voltage amplifier 106, a current amplifier 108, and an ADC 110. The electric meter 100 employs a multi-channel, single-ended ADC 110, which means that a return ground path 111 is shared between the voltage and current channels. As viewed from the voltage amplifier 106, the ADC 110 has an input impedance designated as $Z_v$. Similarly, as viewed from the current amplifier 108, the ADC 110 has an input impedance designated as $Z_i$.

The gain of each of the voltage and current paths may differ from its nominal value due to factors such as component variations. Such variations will cause gain error. One fixed gain calibration generally may be sufficient to compensate for the gain error. Each path may also introduce certain amount of phase delay from the sensors 102, 104 to the respective ADC input and cause phase error. The phase error can be calibrated using reference signals. The calibrated gain and phase delay are static (constants) and are used in digital processing during normal operation to compensate for gain and phase errors. For traditional electric meters where high precision ADCs (such as differential ADCs) are used, the crosstalk between signals can generally be controlled to a minimum through careful board layout, and the static gain and phase calibrations are generally sufficient to ensure power measurement accuracy.

However, for electric meter applications where low cost single-ended ADCs are desired, significant crosstalk persists due to the common return path of multiple signals. The gain and phase calibration techniques noted above are not sufficient when crosstalk is present in the circuit for the following reasons. First, crosstalk varies with the load. Second, the effect of crosstalk also depends on the phase angle between voltage and current (i.e., the power factor angle). Since crosstalk varies depending on load and power factor, the error crosstalk introduces cannot be corrected by traditional static gain and phase calibration.

Figure 2:
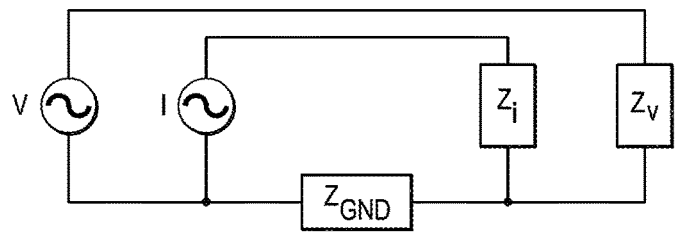
FIG. 2 illustrates an equivalent circuit diagram of the electric meter of FIG. 1 in accordance with various examples.

FIG. 2 illustrates a circuit schematic model of the electric meter 100 of FIG. 1. As explained above, the electric meter employs a common ground architecture. Albeit likely small, the common ground path has an impedance designated as $Z_{GND}$ in FIG. 2. The voltage V and current I represent the voltage and current signal outputs, respectively, from the voltage and current amplifiers 106, 108. The schematic of FIG. 2 illustrates that the voltage signal will be coupled onto the current signal through $Z_{GND}$, and vice versa. Even with a carefully designed board layout, there will always be impedance in the common return path. At low frequencies, the ground impedance, $Z_{GND}$, tends to behave like a pure resistive load.

Figure 3:
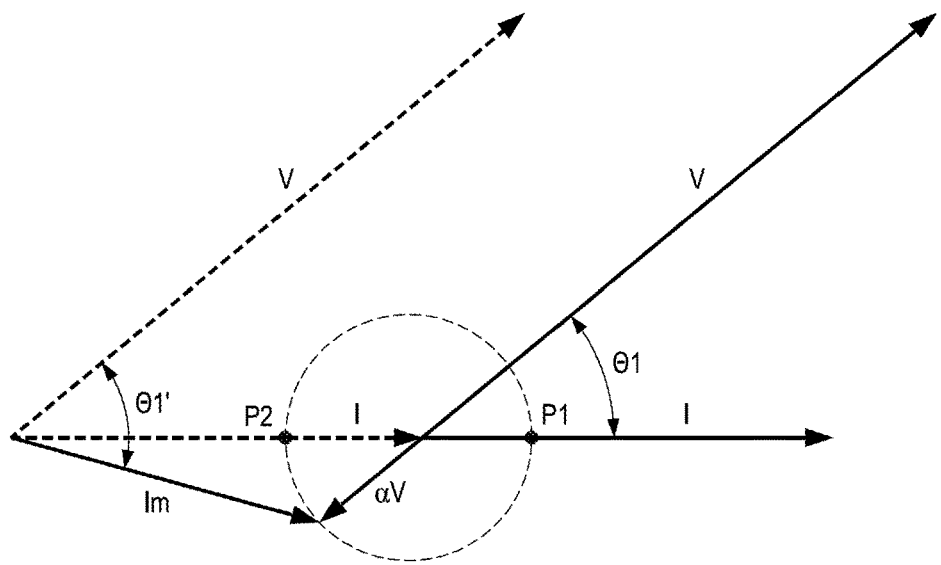
FIG. 3 is a phasor diagram illustrating in-phase crosstalk in accordance with various examples.

FIG. 3 is a phasor diagram illustrating the effect of crosstalk of voltage on current. FIG. 3 shows the voltage and current vectors V and I (illustrated in solid line). The angle (Θ1) between the vectors represents the phase difference between voltage and current and also may be referred to as the power factor angle. The vector designated as αV represents the crosstalk from voltage on current. The crosstalk may be in-phase or out-of-phase with respect to voltage V. FIG. 3 illustrates in-phase cross-talk and FIG. 4 (discussed below) illustrates out-of-phase crosstalk.

Referring still to FIG. 3, the crosstalk factor α may be positive or negative, and thus the in-phase crosstalk αV may have a phase angle with respect to voltage V of 0 degrees or 180 degrees. FIG. 3 shows an example in which α is negative. Out-of-phase crosstalk (FIG. 4) means that αV is at an angle other than 0 or 180 degrees with respect to voltage V. The amount of crosstalk will likely be much smaller than the amount of current I, that is αV<<I, because $Z_{GND}$ is generally small. $Z_{GND}$ is also fixed when the board containing the components of the electric meter 100 is made, which means that α is a constant. In electric meter applications, the voltage V tends to stay the same because the power line voltage usually does not change. Due to the effect of αV, the current detected at the ADC 110 is different than I. In FIG. 3, the ADC measured current is designated as Im. That is, the current sensor 104 generates a current I, but the ADC 110 digitizes a current Im which results from the crosstalk αV generated by the voltage signal path. Moreover, the embodiments described herein provide a technique to calibrate the electric meter so as to permit a calculation by the meter of I from a measurement of Im.

The crosstalk can be easily cancelled or compensated by subtracting αV from Im to recover I if αV is known. The purpose of the technique described below is to compute the crosstalk factor α. The power factor angle Θ1 between V and I can be varied as desired. In some embodiments, for example (and as explained below with respect to FIG. 5), the electric meter 100 can be connected to a test system that can control the amount of voltage and current provided to the electric meter, as well as the power factor angle. As the power factor angle varies so does the angle of αV with respect to current I.

As can be seen from FIG. 3, the Im is a minimum at point P2 (at which the power factor angle would be 0 degrees) and a maximum at point P1 (at which the power factor angle would be 180 degrees). Thus, maximum and minimum RMS current Im is found by sweeping (using the test system) the power factor angle. If the minimum and maximum values of Im coincide with 0 and 180 degree power factor angles, then it is known that in-phase crosstalk is present. If the minimum and maximum values of Im do not coincide with 0 and 180 degree power factor angles, then it is known that out-of-phase crosstalk is present.

The value of α can be computed as:

$$\alpha = \frac{Im(P1) - Im(P2)}{2V} \quad (1)$$

where Im(P1) is the minimum RMS current measurement recorded by the ADC 110 and Im(P2) is the maximum RMS current measurement recorded by the ADC as the power factor angle is swept, and V is the magnitude of the voltage set by the test system. That is, the test system sets V and I and then sweeps the power factor (e.g., from 0 to 360 degrees) while receiving the measured values of current (Im) from the electric meter's ADC. The test system detects the minimum and maximum Im values, computes the difference and divides the difference by twice the voltage V. Note for both in-phase and out-of-phase crosstalks, the same approach is used to obtain crosstalk factor α.

If the crosstalk of voltage on current were purely in-phase, then the computation of α would be a sufficient calibration factor to fully calibrate the electric meter 100 and cancel the effects of the crosstalk. In the case of in-phase crosstalk, the electric meter 100 measures voltage (V) and current (Im), and computes the current without the effect of crosstalk as:

$$I = Im + \alpha V \quad (2)$$

Figure 4:
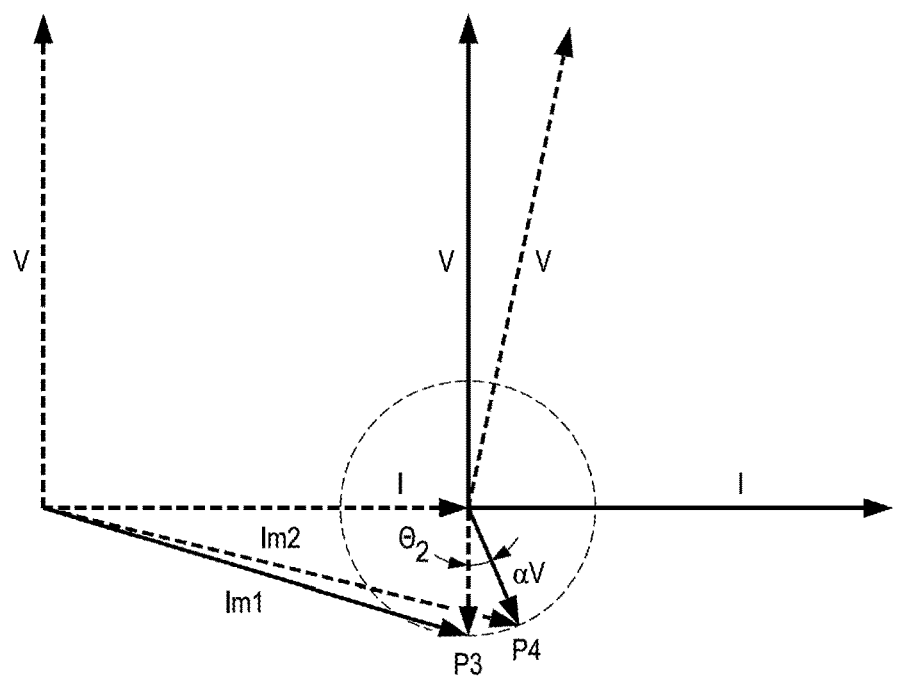
FIG. 4 is a phasor diagram illustrating out-of-phase crosstalk in accordance with various examples.

However, in cases in which crosstalk of voltage on current is out-of-phase with respect to voltage V, then additional calibration factor is calculated in accordance with some embodiments. FIG. 4 illustrates a scenario in which the coupled impedance $Z_{GND}$ is not purely resistive. As can be seen, the αV vector (solid line) is not aligned with V (solid line) and has a phase difference of Θ2 with respect to V. The phase difference Θ2 is a second calibration factor (in addition to calibration factor α) that can be used to calibrate the electric meter in the face of out-of-phase crosstalk of voltage on current. The calibration factor Θ2 can be computed by setting the power factor angle (between V and I) to 90 degrees and measuring the resulting current magnitude. The current magnitude is shown in FIG. 4 as IM2 and coincides with point P4 as shown. The value of Θ2 is computed as:

$$\theta 2 = \frac{Im2 - I}{\alpha V} \quad (3)$$

With both calibration factors α and Θ2, the electric meter can compensate the measured current Im as follows:

$$I = Im + \alpha V e^{\theta 2} \quad (4)$$

In some embodiments, equation (4) is used to compensate the measured current regardless of whether the crosstalk is in-phase or out-of-phase with respect to voltage V. If the crosstalk is in-phase, Θ2 will be 0. As a result, current compensation equation (4) reduces to equation (2). If the crosstalk is out-of-phase, the test system computes Θ2 as explained above and still uses equation (4).

Figure 5:
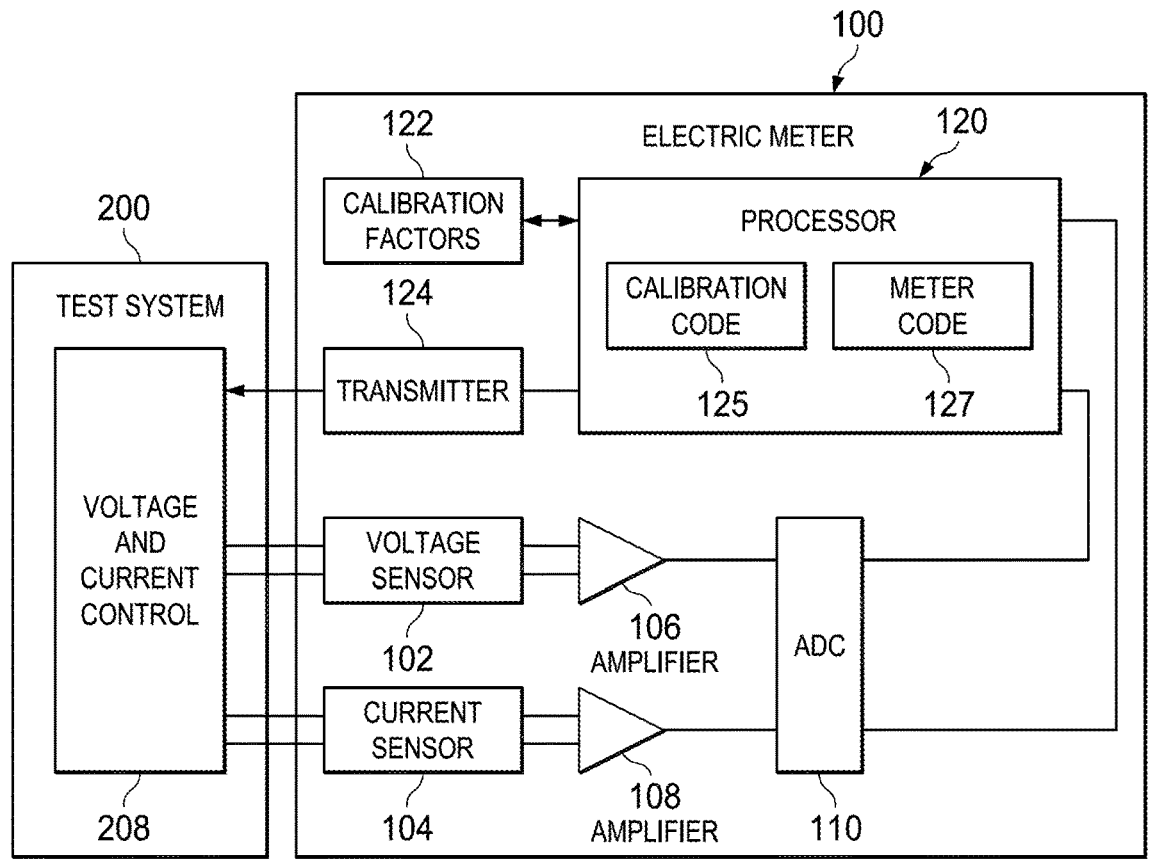
FIG. 5 shows the electric meter coupled to a test system to perform a calibration process in accordance with various examples.

FIG. 5 illustrates the electric meter 100 coupled to a test system 200 during a calibration factor determination process. The process may be performed upon manufacturing of the electric meter or subsequently, but preferably before the meter is used to take voltage and current measurements. The process described below may be performed only once or multiple times during the life of the meter.

The test system 200 includes a voltage and current control 208 which comprises voltage and current generators capable of generating a voltage and a current at magnitudes dictated by the processor 202 and at a power factor angle also dictated by the processor 202. The power factor can be set to a specific value (e.g., 90 degrees) by the test system 200 or swept through a range of values (e.g., 0 to 360 degrees). The test system 200 may be implemented as a computer, custom standalone test device, or as any other type of electronic system. In general, the test system 200 generates high precision voltage and current source signals which are used to calibrate the electric meter 100.

The electric meter includes the voltage and current sensors 102 and 104, amplifiers 106 and 108, ADC 110, a processor 120, calibration factor storage 122, and a transmitter 124. The ADC 110 may be a component of the processor 120, or may be separate from the processor 120. The processor 120 includes CAL code 125 and meter code 127. The CAL code 125 comprises machine instructions that are executable by the processor 120 to perform the calibration described herein, and the meter code comprises machine instructions that are executable by the processor 120 to operate the meter during run-time to measure power consumption by the user of the meter. The power computation results of the electric meter 200 can be transmitted to the test system 200 via the transmitter 124. The test system 200 can verify and report the accuracy of the electric meter's power computations. The computed calibration factors (e.g., Θ2 and α) are computed by the processor 120 during execution of CAL code 125 and stored in CAL factor storage 122 for subsequent use during runtime by execution of the meter code 127.

The digital output of the ADC 110 can be provide to the processor 120, and the processor 120 can access the calibration factor storage 122 to store the computed α and Θ2 calibration factors. The processor 120 performs multiple operations. For instance, the processor 120 during calibration time, executes calibration code (125) to obtain calibration factors (122); (2) during normal meter operation, compute V, I, power.

In the embodiment of FIG. 5, the calibration code 125 executes in the electric meter to calibration the meter. In other embodiments, the calibration code executes in the test system 200 on a processor contained therein. In this latter embodiment, the test system receives digitized current and voltage measurements from the electric meter, computes the calibration factors, and programs the calibration back into the CAL factor storage 122 in the meter.

Figure 6:
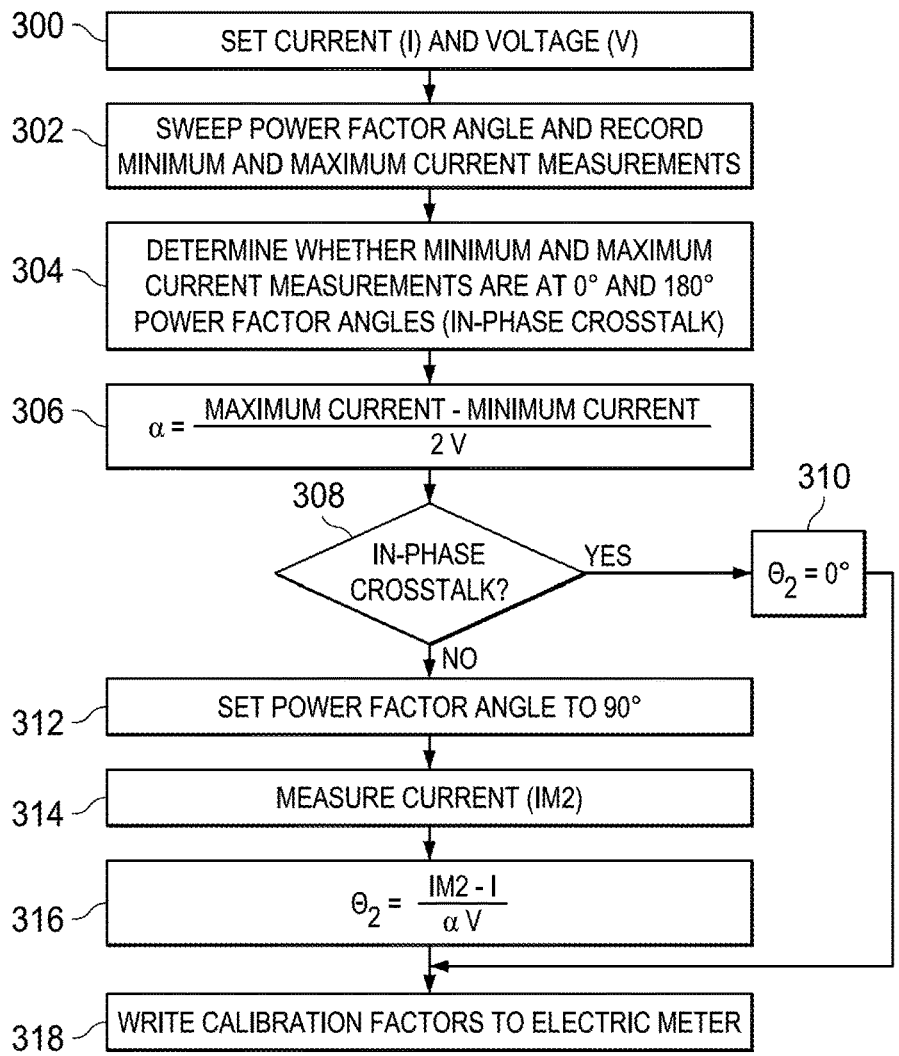
FIG. 6 is a method for calibrating the electric meter in accordance with various examples.

FIG. 6 illustrates a flow chart of the calibration process performed by test system 200 and processor 120 in accordance with various embodiments. The operations may be performed in the order shown, or in a different order. Further, two or more of the operations may be performed concurrently, instead of sequentially.

At 300, the test system 200 sets a current (I) and a voltage (V) through, for example, the voltage and current control 208. The magnitude of I and V may be indicative of typical values seen by electric meters in the field, but in general can be any desired values.

At 302, the method includes sweeping the factor angle and recording the minimum and maximum current measurements. The test system 200 can assert a signal to the voltage and current control 208 to sweep the power factor angle from a first angle (e.g., 0 degrees) to a second angle (e.g., 360 degrees), while the processor 120 computes current based on the digitized current readings from the meter's ADC 110. The processor 120 determines the minimum and maximum current measurements received from the ADC 110 during the power factor angle sweep.

At 304, the calibration process further includes determining whether the minimum and maximum current measurements coincided with power factor angles of 0 and 180 degrees. If minimum and maximum current measurements coincide with power factor angles of 0 and 180 degrees, then the crosstalk is determined to be in-phase. The processor 202 may set a flag or a variable to indicate whether the crosstalk is in-phase or out-of-phase.

The value of the α calibration factor is computed at 306. The value of α may be computed as per equation (1) above as the difference between the maximum and minimum current measurements divided by 2*V. If at 308 the crosstalk is determined to be in-phase, then at 310, the value of the Θ2 calibration factor is set to 0. Otherwise, if the crosstalk is determined to be out-of-phase, then at 312, the test system 200 sets the power factor angle between voltage and current to 90 degrees. At 314, the method then includes measuring the current, which may be performed by retrieving an output digital current value from ADC 110. At 316, the method then computes the Θ2 calibration factor per equation (3) above.

At 318, the processor 120 writes the calibration factors α and Θ2 to the electric meter 100, for example to the meter's calibration factor storage 122. The electric meter then can be installed in the field (e.g., at a residence, business, etc.).

Figure 7:
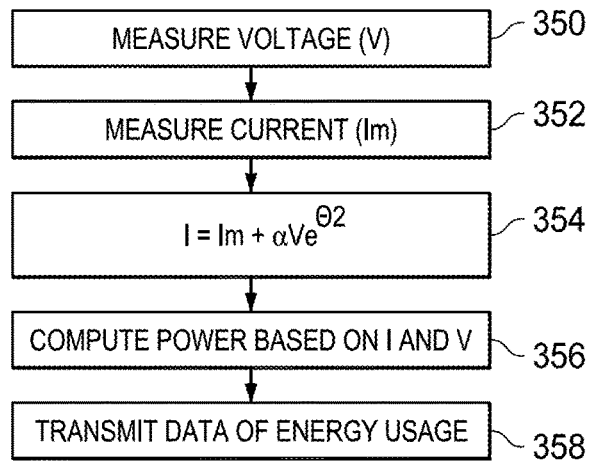
FIG. 7 is a method performed by the electric meter in the field to compensate measured current based on calibration factors determined during the calibration process in accordance with various examples.

FIG. 7 illustrates an example of a method of operation of the electric meter 100 following being programmed with the calibration factors. The operations may be performed by the processor 120 in the meter and may be performed in the order shown, or in a different order. Two or more of the operations may be performed concurrently instead of sequentially.

At 350 and 354, the meter takes respective voltage (V) and current (Im) measurements. The meter may be preprogrammed to do so or may receive a command to take the measurements.

At 354, the meter compensates the measured value of current (Im) based on the calibration factors α and Θ2 per equation (4) above. The meter also may compute power based on the compensated value of current (I) and the measured value of voltage (V) at 356 and transmit data of energy usage (e.g., the calculated power) through the transmitter 124.

Figure 8:
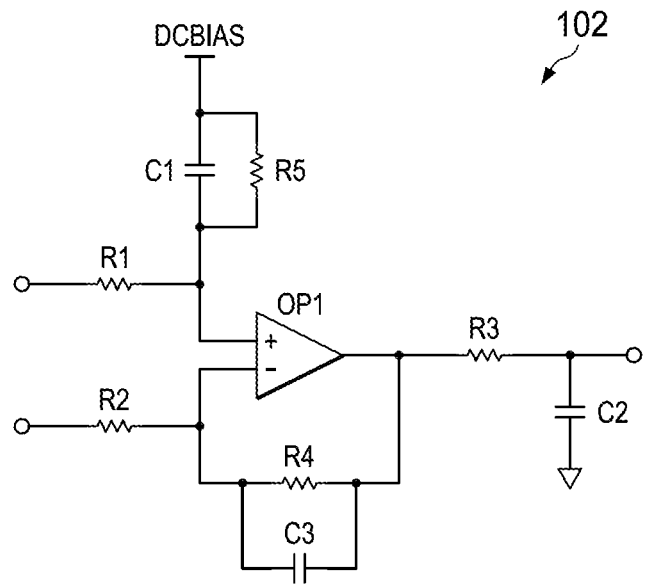
FIG. 8 is an example of a voltage sensing circuit usable in the electric meter of FIG. 1.
Figure 9:
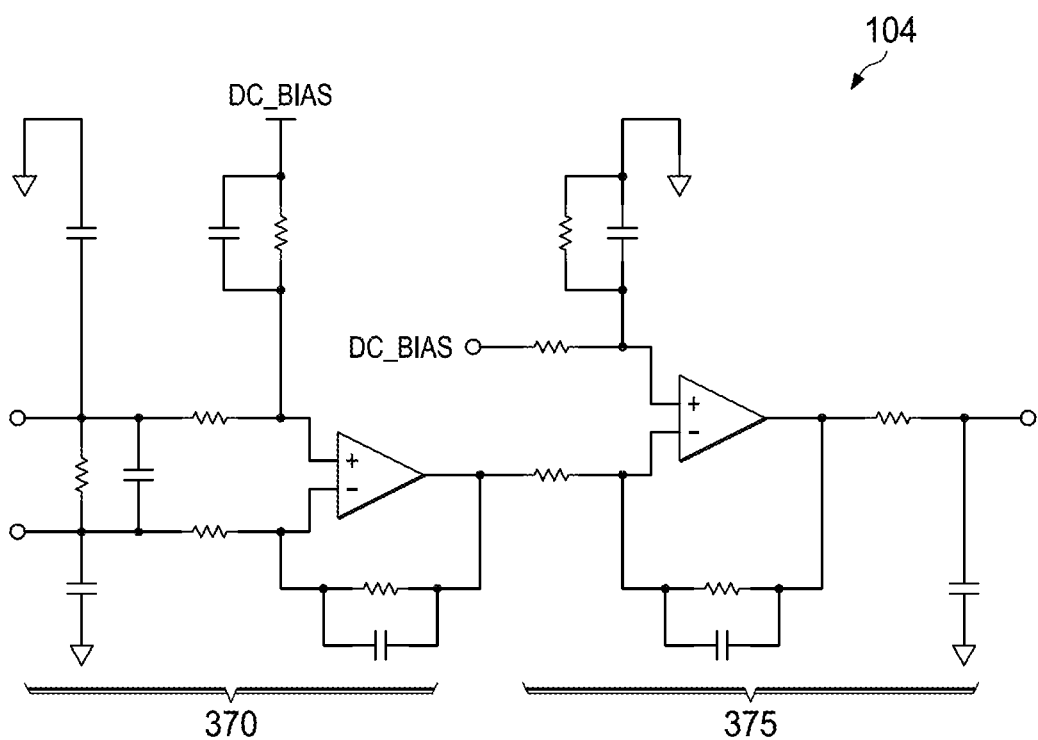
FIG. 9 is an example of a current sensing circuit usable in the electric meter of FIG. 1.

The voltage and current sensors 102, 104 can be implemented using any suitable sensor circuit. FIG. 8, for example, illustrates one embodiment of a voltage sensor 102. The sensor includes resistors R1, R2, R3, R4, and R5, capacitors C1, C2, and C3, and an operational amplifier OP1. The voltage sensor in the example of FIG. 8 is configured as a differential amplifier circuit with negative feedback via resistor R4. FIG. 9 illustrates an embodiment of a current sensor 104. The current sensor in the example of FIG. 9 has two gain stages 370, 375 connected in series.

All references to numerical values such as power factor angles (e.g., 0 degrees, 180 degrees, 360 degrees) refer to approximate numerical values. Thus, a reference to 90 degrees means approximately 90 degrees. In some embodiments, "approximate" may mean+/−5%.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of calibrating an electric meter, comprising:
generating, by a current generator of a voltage and current control, a current (I) for the electric meter;
generating, by a voltage generator of the voltage and current control, a voltage (V) for the electric meter;
sweeping, by the voltage and current control, a power factor angle between the voltage and the current, while measuring, by a current sensor of the electric meter, a minimum current value and a maximum current value; and
computing, with one or more processors, a first calibration factor as a difference between the minimum current value and the maximum current value, divided by 2*V;
with the one or more processors, when a voltage-induced cross-talk is in-phase with the voltage, setting a second calibration factor to 0; and
with the one or more processors, when the voltage-induced cross-talk is out-of-phase with the voltage, computing the second calibration factor based on a current value measured when the power factor angle is set to 90 degrees.

2. The method of claim 1, further comprising determining whether the voltage-induced cross-talk is in-phase or out-of-phase with the voltage.

3. The method of claim 2, wherein determining whether the voltage-induced cross-talk is in-phase or out-of-phase with the voltage comprises determining whether the minimum current value and the maximum current value occurred at power factor angles of 0 degrees and 180 degrees.

4. The method of claim 1, wherein when the voltage-induced cross-talk is out-of-phase with the voltage:
   setting the power factor angle to 90 degrees;
   measuring the current value (Im); and
   computing the second calibration factor based on Im and the first calibration factor.

5. The method of claim 1, wherein when the voltage-induced cross-talk is out-of-phase with the voltage:
   setting the power factor angle to 90 degrees;
   measuring the current value (Im); and
   computing the second calibration factor as $$\frac{Im - I}{\text{first calibration factor} * V}.$$

6. The method of claim 1, further comprising loading the first and second calibration factors into storage in the electric meter.

7. An apparatus, comprising:
   a voltage and current control, comprising:
      a current generator to generate a current (I) for an electric meter;
      a voltage generator to generate a voltage (V) for the electric meter;
      the voltage and current control to sweep a power factor angle while a current sensor of the electric meter measures a minimum current value and a maximum current value; and
   a processor configured to compute a first calibration factor as a difference between the minimum current value and the maximum current value, divided by 2*V and, when a voltage-induced cross-talk is out-of-phase with the voltage, compute a second calibration factor based on the first calibration factor and a current value measured when the power factor angle is set to 90 degrees.

8. The apparatus of claim 7, wherein the processor is configured to determine that the voltage-induced cross-talk is in-phase with the voltage and set the second calibration factor to 0.

9. The apparatus of claim 7, wherein the processor is further configured to determine whether the voltage-induced cross-talk is in-phase or out-of-phase with the voltage.

10. The apparatus of claim 7, wherein the processor is further configured to determine whether the voltage-induced cross-talk is in-phase or out-of-phase with the voltage through determination of whether the minimum current value and the maximum current value occurred at power factor angles of 0 degrees and 180 degrees.

11. The apparatus of claim 7, wherein when the voltage-induced cross-talk is out-of-phase with the voltage, the processor is configured to:
   set the power factor angle to 90 degrees;
   measure the current value (Im); and
   compute the second calibration factor based on Im and the first calibration factor.

12. The apparatus of claim 7, wherein when the voltage-induced cross-talk is out-of-phase with the voltage, the processor is configured to:
   set the power factor angle to 90 degrees;
   measure the current value (Im); and
   compute the second calibration factor as $$\frac{Im - I}{\text{first calibration factor} * V}.$$

13. The apparatus of claim 7, wherein the processor computes the first and second calibration factors and stores the first and second calibration factors into storage in the electric meter.

14. The apparatus of claim 7, wherein the processor is included in the electric meter.

15. An electric meter, comprising:
   a voltage sensor to measure an analog voltage;
   a current sensor to measure an analog current;
   an analog-to-digital converter (ADC) coupled to the voltage sensor and to the current sensor, the ADC to convert the analog voltage to a digital voltage (V) and to convert the analog current to a digital current (Im);
   a processor coupled to the ADC, the processor configured to:
      compute a current value (I) based on Im and a calibration factor; and
      compute a power value based on I and V.

16. The electric meter of claim 15, wherein the calibration factor is a first calibration factor and the processor is configured to compute I based on Im and first and second calibration factors.

17. The electric meter of claim 15, wherein the processor or microcontroller is configured to compute I as: $I = Im + \alpha V e^{\Theta 2}$, where $\alpha$ is the first calibration factor and $\Theta 2$ is the second calibration factor.

18. The electric meter of claim 17, wherein $\Theta 2$ is a function of first calibration factor, a voltage sensed by the voltage sensor, and a measured current when a power factor angle between current voltage is set to 90 degrees.

19. The electric meter of claim 17, wherein $\Theta 2$ is 0.

20. The electric meter of claim 17, further comprising a transmitter, and wherein the processor is configured to transmit energy data through the transmitter.

* * * * *